United States Patent [19]
Westcott
[11] Patent Number: 4,992,635
[45] Date of Patent: Feb. 12, 1991

[54] SELF LOCATING PUSH-BUTTON SWITCH BOX

[75] Inventor: James A. Wescott, New York, N.Y.
[73] Assignee: Marilyn L. Keegan, New York, N.Y. ; a part interest

[21] Appl. No.: 387,869
[22] Filed: Jul. 31, 1989
[51] Int. Cl.[5] .......................... H01H 9/02; H05K 5/02
[52] U.S. Cl. ..................................... 200/293; 200/294; 200/61.62; 200/61.81
[58] Field of Search ...................... 200/293, 341, 61.62, 200/294, 297, 61.81, 61.82

[56] References Cited

U.S. PATENT DOCUMENTS

| | | | |
|---|---|---|---|
| 2,671,162 | 3/1954 | Beline | 200/294 |
| 2,835,771 | 5/1958 | Bausch | 200/61.62 |
| 3,251,971 | 5/1966 | Fraser | 200/61.62 |
| 3,270,333 | 8/1966 | Barber | 200/61.81 |

*Primary Examiner*—Henry J. Recla
*Assistant Examiner*—Keith Kupferschmid

[57] ABSTRACT

A self-locating push button switch box for rapid mounting comprising, a generally parallel piped housing, formed from a planar blank, and comprising an elongated top wall, elongated bottom wall, elongated side wall, rear end wall, and front end wall, a spacing tab integral with one of the walls and an adjacent top or bottom wall and projecting forwardly of the front wall a predetermined distance; and a stop tab integral with the spacing tab and projecting perpendicularly outwardly therefrom, the front wall defining a push-button switch mounting opening centrally therein, the rear end wall defining an opening for electric wiring for connection to an elongated push-button switch mounted within the opening and having a biased switch button projecting forwardly beyond a plane defined by the stop tabs.

3 Claims, 2 Drawing Sheets

SELF LOCATING PUSH-BUTTON SWITCH BOX

BACKGROUND AND SUMMARY OF PRESENT INVENTION

The present invention relates to electrical switch boxes in general and switch boxes in particular adapted for push-button type switches which are to be installed in closets or drawers for alarming the same or otherwise lighting the same when the push-button switch is wired to an appropriate alarm device or lighting fixture.

While electrical switch boxes of generally parallelpiped form are very well known to the art and switch boxes for push-button switches are also known to the art, there has been a need for a push-button switch box which may be installed simply, quickly, and efficiently in a frame of a sliding drawer which is to be closed or in the frame of a closet which is to be closed in a manner whereby the closure of a door or of a sliding drawer makes contact with a projecting push-button in the plane of closure. It is to such a new and improved construction that the present invention is directed.

Specifically, the self-locating push-button switch box of the present invention includes a pair of recessing or spacing tabs integrally connected to right angular locating or stop tabs in a manner whereby the switch box itself may be installed in a corner of the drawer frame or in the corner of the door frame by simply attaching the switch box itself to the frame through mounting screws projecting through one of the walls of the switch box after the stop tabs have been placed in abutment with the fact of the frame.

Thus, in accordance with the principles of the present invention, an electrician wiring an alarm for a drawer or closet or otherwise wiring a lighting fixture for a drawer or closet may simply place the new and improved self-locating push-button switch box of the present invention in a corner of the frame of the door or drawer with the sides of the box aligned with the corner of the frame and with the locating or stop tabs pressed against the outer edges of the frame in a manner whereby the switch box is automatically recessed a predetermined amount inwardly of the plane of closure of the frame by a distance equal to the dimensions of the spacing tab members with the precise location being automatically established by the stop tabs formed at right angles to the spacing tabs.

For a more complete understanding of the construction of the present invention and a more complete appreciation of the attendant advantages of its use, reference should be made to the following detailed description of the invention taken in conjunction with the accompanying drawings.

DETAILED DESCRIPTION OF THE INVENTION

Figure 1:
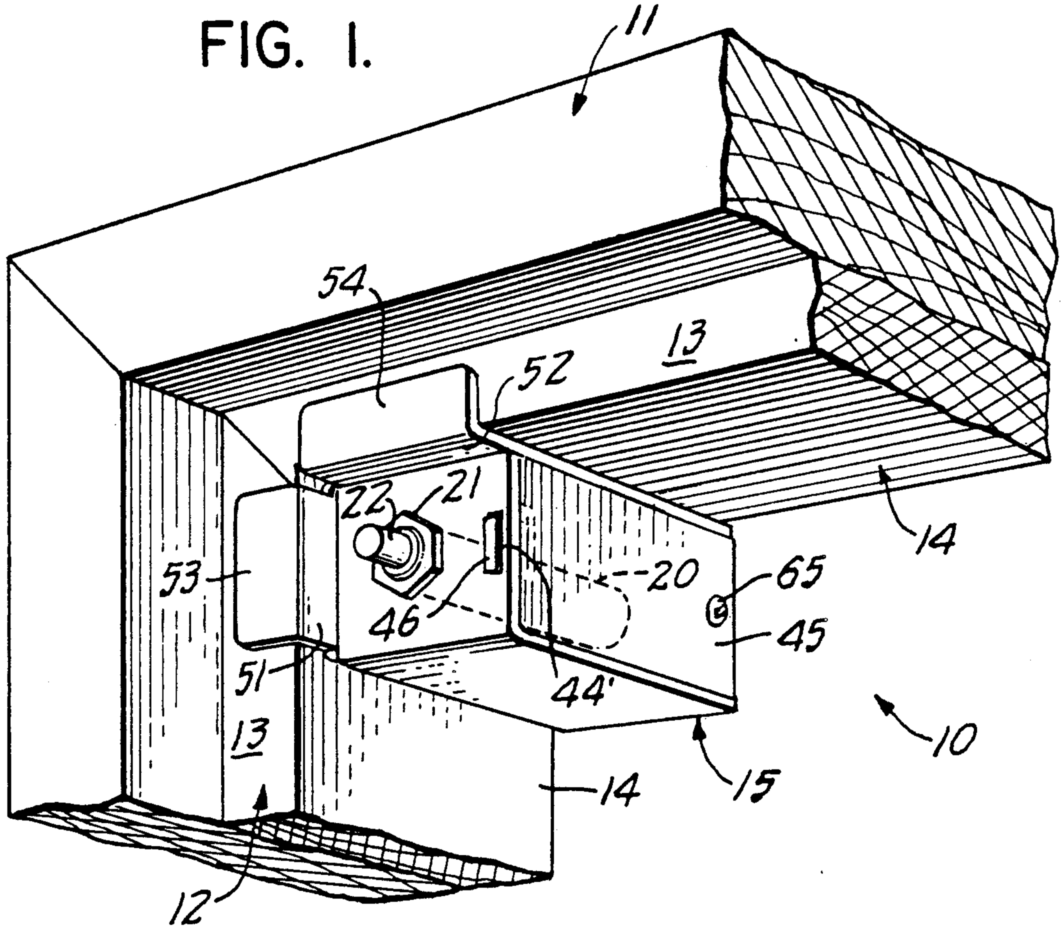
FIG. 1. is a perspective view of a frame in which the self-locating push-button switch box of the present invention is mounted in predetermined recessed relation to the plane of closure with a switch push-button projecting beyond said plane for actuation by contact with a closing drawer or door member.

Referring now to FIG. 1, a drawer or closet frame 10 is shown having an outer rectangular frame 11 and an inner stopping frame 12, the end faces 13 of which define the plane of closure of the frame against which a swinging door or sliding drawer will abut in the closed position and from which the drawer or door will be spaced in the open position.

In accordance with the principles of the invention, the new and improved push-button switch box 15 may be automatically and simply located in one corner of the frame 10 directly against the inner edge 14 of the stopping frame 12.

The switch box 15 has a push button switch 20 disposed internally thereof, and permanently connected thereto by an appropriate fastening means such as a locking nut 21. The spring-biased axially displaceable push-button 22 projects in a normally extended first position outwardly beyond the closure plane defined by the faces of the stopping frame 13, as will be understood. In this position the switch is in a first "on" condition. In accordance with the principles of the present invention, and as will be understood, when the door or drawer associated with the frame 10 is closed to abut against the stopping surfaces 13, the inner plane of the door or the drawer will contact and depress the push-button 22 moving the switch into a second "off" position. As will be appreciated the switch will be hard-wired into an alarm which will go off when the drawer is opened or otherwise hard-wired to a light fixture which will be energized when the drawer is opened. Similarly, the switch will function to alarm or to light a closet or a room when installed on a door frame.

As an important and critical aspect of the present invention, the switch box of the present invention may be rapidly mounted by an electrician or by a carpenter by merely sliding the unit 15 into a corner of the frame in a manner whereby the switch 20 is properly located with respect to the entire frame by virtue of the inclusion of locating tabs 51, 52 and stop tabs 53, 54, which will automatically recess the front face 43 of the new switch box with respect to the plane of closure of the frame. In this manner the switch box 15 can be quickly connected by simply placing screws through mounting holes 33 formed in a wall 41 of the switch box.

Figure 2:
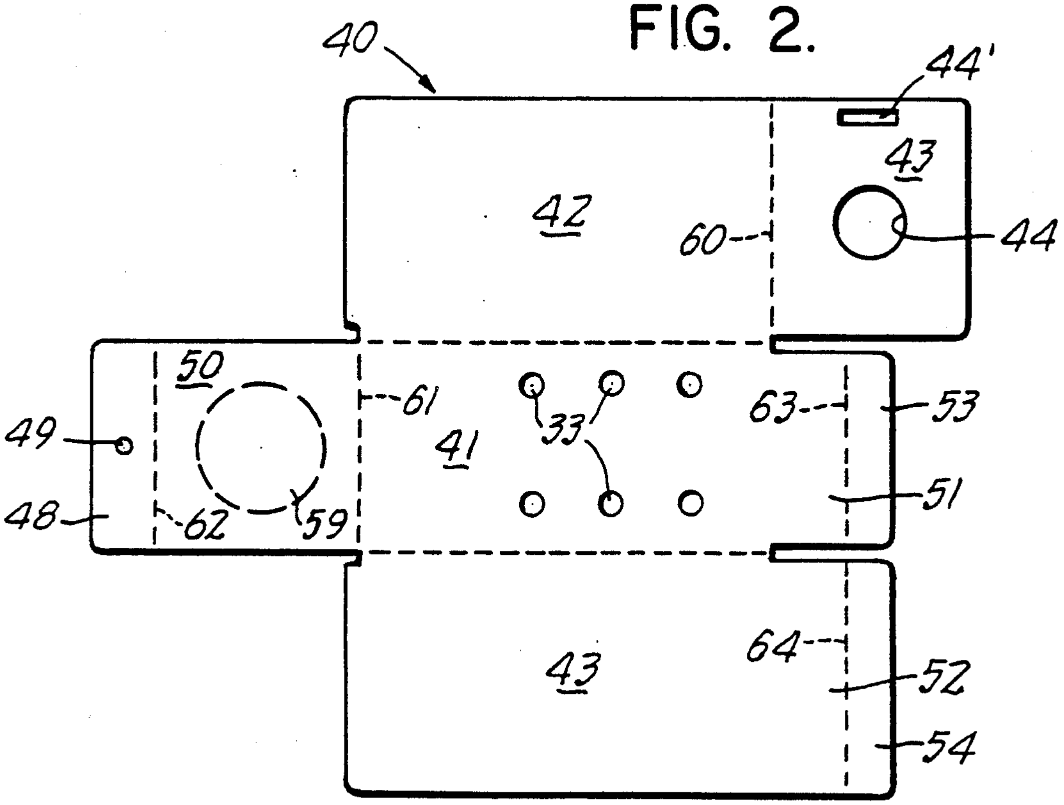
FIG. 2. is a plan view of a sheet metal blank from which the switch box of the invention may be fabricated by appropriate bending operations.
Figure 3:
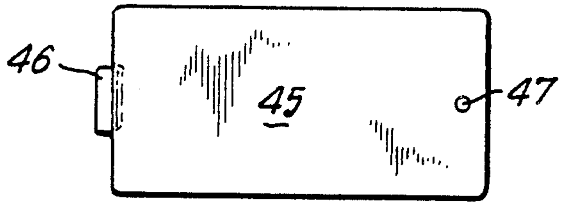
FIG. 3. is a plan view of the top closing panel of the new switch box of the invention.

In accordance with the principles of the present invention, the switch box may be readily manufactured from a planar sheet metal blank 40 (FIG. 2) having a bottom wall 41, contiguous first side wall 42, and a contiguous second side wall 43. Articulated to the first side wall 42 is a front wall 43 having an circular opening 44 through which the switch 20 may be mounted and having a narrow slot 44' for receiving a closure panel 45 having a closure tab 46 (FIGS. 3 and 8), which is adapted to be inserted into the slot 44' as will be understood. The closure panel 45 also has a small opening 47 through which it may be fastened to a closure tab 48 having a correspondingly located hole 49. The closure tab 48 is articulated to the rear wall panel 50 having a wire opening 59 of the switch box blank as shown in FIG. 2. The blank 40 further includes, in accordance with the principles of the present invention, a recessing or spacing tab 51 representing an integral extension of the wall 41 and a spacing tab or recessing tab 52 representing an integral extension of the wall 43. Articulated to the end of tabs 51, 52 respectively are stop tabs 53, 54.

Figure 8:
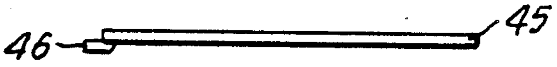
FIG. 8. is a side elevational view of the top closing panel.
Figure 4:
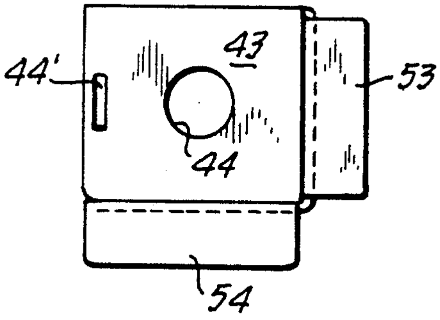
FIG. 4. is a front elevational view of the new switch box of the invention.
Figure 6:
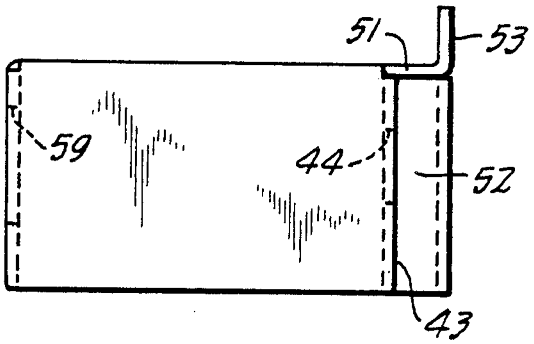
FIG. 6. is a side elevational view of the invention.
Figure 5:
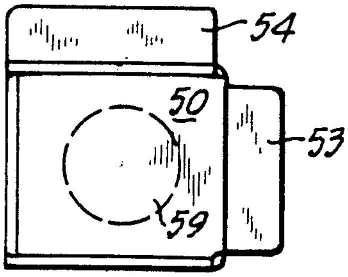
FIG. 5. is a rear elevational view of the switch box of the invention.
Figure 7:
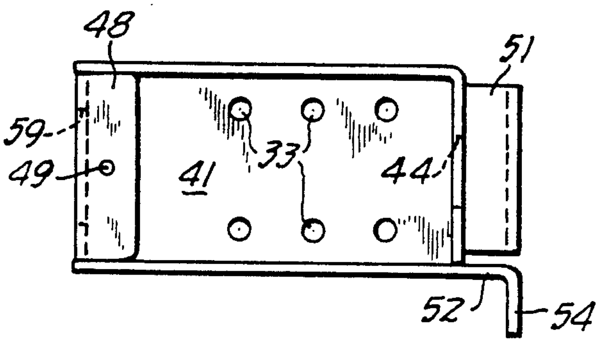
FIG. 7. is an opposite side elevational view of the invention.

As shown in FIG. 2, the end wall 50 is articulated to the wall 41 in a slightly offset manner in order that when it is bent it will form a regular parallelpiped structure as shown in FIG. 1. More specifically, the blank 40 is folded along the hinge lines 60, 61, 62, 63, and 64 at right angles to form the switch box with tabs 51–54 shown in FIGS. 1 and 4 through 7. As will be appreciated, the parallelpiped box 15 will, when so bent, have a stop tab 53 which is recessed inwardly of the plane of closure of the door or drawer, which in the switch box is defined by the stop tabs 53, 54 which will bear against the wall surfaces 13. This will space or recess the stop tab 53 inwardly of the plane of closure by a distance equal to the width of the tabs 51, 52, as will be understood. The switch box of the invention will be closed by the top panel 45 by insertion of the bent tab 46, which is shown in FIG. 8, into the receiving slot 44, and thereafter connecting the panel 45 to the tab 48 by a screw 65 or other fastening means passing through the holes 47, 49.

While the present invention has been described with reference to a particular preferred embodiment, it should be understood that certain variations will be apparent to those skilled in the art, (for example, making the top panel 45 integral with the blank 40 and connected to one of the walls 42, 43) without departing from the clear scope of the invention as defined hereinafter in the appended claims.

I claim:

1. A self-locating push button switch box comprising:
(a) a generally parallelpiped housing, including an elongated top wall, elongated bottom wall, two elongated side walls, rear end wall, and front end wall, one of which elongated walls is a closing panel independent of and selectively removable from the housing;
(b) spacing tab means integral with one of the nonremovable elongated side wall and an adjacent top wall and projecting from said front wall a predetermined distance;
(c) stop tab means integral with said spacing tab means and projecting perpendicularly outwardly therefrom and defining a plane;
(d) said front wall defining a push-button switch mounting opening centrally therein;
(e) said rear end wall defining an opening for electric wiring for connection to a switch means;
(f) elongated push-button switch means mounted within said suitable mounting opening and having a biased switch button projecting forwardly beyond the plane defined by said stop tabs;
(g) said closing panel having a connecting tab at one end and a mounting hole at the other end;
(h) a slot formed in one of said end walls receiving said connecting tab;
(i) a tab defining a mounting hole formed integrally with said other end wall;
(j) whereby said closing panel may be fastened between said end walls through said connecting tab and said mounting hole.

2. The switch box of claim 1, further characterized, in that
(a) one of said elongated walls having said spacing tabs includes at least one mounting hole adapted for fastening said switch box to a corner of a frame with said switch box in recessed relation to said frame and said push-button projecting forwardly of a face of said frame when said elongated walls are aligned with the corner of said frame with said stop tabs resting flushly against the face of said frame.

3. A planar sheet metal blank adapted to be bent into a parallelpipe-shaped switch box, comprising:
(a) an elongated first side wall with a front end wall integral therewith;
(b) an elongated bottom wall having first and second side edges and having a rear end wall integral therewith, said first side wall articulated to said bottom wall along said first edge;
(c) an elongated second side wall articulated to said elongated bottom wall along said second edge;
(d) spacing tabs extending from said bottom wall and said second side wall;
(e) locating tabs connected to the ends of said spacing tabs;
(f) openings defined in said front and rear end walls to accommodate a push-button switch and associated electrical wiring; and
(g) the blank being formed into a parallelpipe-shaped switch box by bending the elongated first and second side walls at the first and second edges respectively such that said first and second side walls are approximately parallel to each other and approximately perpendicular to said elongated bottom wall; and bending said front and rear walls such that they are approximately parallel to each other and perpendicular to the bottom wall.

* * * * *